(12) United States Patent
Lin et al.

(10) Patent No.: US 10,763,377 B2
(45) Date of Patent: Sep. 1, 2020

(54) BIFACIAL P-TYPE PERC SOLAR CELL AND MODULE, SYSTEM, AND PREPARATION METHOD THEREOF

(71) Applicants: Guangdong Aiko Solar Energy Technology Co., Ltd., Foshan, Guangdong (CN); Zhejiang Aiko Solar Energy Technology Co., Ltd., Yiwu, Zhejiang Province (CN)

(72) Inventors: Kang-Cheng Lin, Foshan (CN); Jiebin Fang, Foshan (CN); Gang Chen, Foshan (CN)

(73) Assignees: Guangdong Aiko Solar Energy Technology Co., Ltd., Foshan, Guangdong (CN); Zhejiang Aiko Solar Energy Technology Co., Ltd., Yiwu, Zhejiang Province (CN)

( * ) Notice: Subject to any disclaimer, the term of this patent is extended or adjusted under 35 U.S.C. 154(b) by 0 days.

(21) Appl. No.: 16/489,663

(22) PCT Filed: Feb. 28, 2018

(86) PCT No.: PCT/CN2018/077593
§ 371 (c)(1),
(2) Date: Aug. 28, 2019

(87) PCT Pub. No.: WO2018/157826
PCT Pub. Date: Sep. 7, 2018

(65) Prior Publication Data
US 2020/0013909 A1    Jan. 9, 2020

(30) Foreign Application Priority Data
Mar. 3, 2017 (CN) .......................... 2017 1 0122960

(51) Int. Cl.
*H01L 31/0224* (2006.01)
*H01L 31/02* (2006.01)
(Continued)

(52) U.S. Cl.
CPC ............... *H01L 31/022425* (2013.01); *H01L 31/02008* (2013.01); *H01L 31/035281* (2013.01); *H01L 31/1804* (2013.01)

(58) Field of Classification Search
None
See application file for complete search history.

(56) References Cited

U.S. PATENT DOCUMENTS

2012/0204928 A1* 8/2012 Kutzer ................. H01L 31/068
136/244
2014/0332072 A1* 11/2014 Beaucarne ............. H01L 31/18
136/256

(Continued)

FOREIGN PATENT DOCUMENTS

CN   206628482 U   11/2014
CN   104201214 A   12/2014

(Continued)

OTHER PUBLICATIONS

International Search Report, dated May 3, 2018, for International Application No. PCT/CN2018/077593, 5 pages. (with English translation).

*Primary Examiner* — Asok K Sarkar
(74) *Attorney, Agent, or Firm* — Seed IP Law Group LLP

(57) ABSTRACT

The present invention discloses a bifacial P-type PERC solar cell, which consecutively comprises a rear silver electrode, a rear aluminum grid, a rear passivation layer, P-type silicon, an N-type emitter, a front silicon nitride film, and a front silver electrode, wherein the rear silver electrode intersects with the rear aluminum grid line by a first predetermined angle, the first predetermined angle being greater than 10

(Continued)

degrees and smaller than 90 degrees; the rear passivation layer is grooved with laser to form a first laser grooving region, which is disposed below the rear aluminum grid line; the rear aluminum grid line is connected to the P-type silicon via the first laser grooving region and is provided at its periphery with an outer aluminum grid frame, the outer aluminum grid frame being connected to the rear aluminum grid line and the rear silver electrode. The present invention is simple in structure, low in cost, easy to popularize, and has high photoelectric conversion efficiency.

3 Claims, 3 Drawing Sheets

(51) Int. Cl.
*H01L 31/0352* (2006.01)
*H01L 31/18* (2006.01)

(56) References Cited

U.S. PATENT DOCUMENTS

| | | | |
|---|---|---|---|
| 2014/0345685 A1* | 11/2014 | Albaugh | H01L 31/02242 136/256 |
| 2015/0295102 A1* | 10/2015 | Richter | H01L 31/02242 136/256 |
| 2016/0049540 A1* | 2/2016 | Kapur | H01L 31/068 136/256 |
| 2016/0300963 A1* | 10/2016 | Kuo | H01L 31/068 |
| 2016/0365469 A1* | 12/2016 | Steckemetz | H01L 31/0201 |
| 2019/0006544 A1* | 1/2019 | Terashita | H01L 31/0201 |

FOREIGN PATENT DOCUMENTS

| | | |
|---|---|---|
| CN | 203983300 U | 12/2014 |
| CN | 104576773 A | 4/2015 |
| CN | 106449877 A | 2/2017 |
| CN | 106876496 A | 6/2017 |

* cited by examiner

BIFACIAL P-TYPE PERC SOLAR CELL AND MODULE, SYSTEM, AND PREPARATION METHOD THEREOF

FIELD

The present invention relates to the field of solar cells, and in particular to a bifacial P-type PERC solar cell, a method of preparing the bifacial P-type PERC solar cell, a solar cell module that employs the bifacial P-type PERC solar cell, and a solar system that employs the bifacial P-type PERC solar cell.

BACKGROUND

A crystalline silicon solar cell is a device that effectively absorbs solar radiation energy and converts light energy into electrical energy through the photovoltaic effect.

When sunlight reaches the p-n junction of a semiconductor, new electron-hole pairs are generated. Under the action of the electric field of the p-n junction, the holes flow from the N zone to the P zone, and the electrons flow from the P zone to the N zone, generating current upon switching on a circuit.

In a conventional crystalline silicon solar cell, surface passivation is basically only performed at the front surface, which involves depositing a layer of silicon nitride on the front surface of the silicon wafer via PECVD to reduce the recombination rate of the minority carriers at the front surface. As a result, the open-circuit voltage and short-circuit current of the crystalline silicon cell can be greatly increased, which leads to an increase of the photoelectric conversion efficiency of the crystalline silicon solar cell. However, as passivation is not provided at the rear surface of the silicon wafer, the increase in photoelectric conversion efficiency is still limited.

The structure of an existing bifacial solar cell is as follows: the substrate is an N-type silicon wafer; when photons from the sun reach the rear surface of the cell, the carriers generated in the N-type silicon wafer pass through the silicon wafer, which has a thickness of about 200 μm; as in an N-type silicon wafer, the minority carriers have a long lifetime and carrier recombination rate is low, some carriers are able to reach the p-n junction at the front surface; the front surface of the solar cell is the main light-receiving surface, and its conversion efficiency accounts for a high proportion of the conversion efficiency of the whole cell; as a result of overall actions at both the front surface and the rear surface, the conversion efficiency of the cell is significantly increased. However, the price of an N-type silicon wafer is high, and the process of manufacturing a bifacial N-type cell is complicated. Therefore, a hotspot for enterprises and researchers is to how to develop a bifacial solar cell with high efficiency and low cost.

On the other hand, in order to meet the ever-rising requirements for the photoelectric conversion efficiency of crystalline silicon cells, the industry has been researching rear-surface passivation techniques for PERC solar cells. Mainstream manufacturers in the industry are mainly developing monofacial PERC solar cells. The present invention combines a highly efficient PERC cell and a bifacial cell to develop a bifacial PERC solar cell that has overall higher photoelectric conversion efficiency.

Bifacial PERC solar cells have higher usage values in the practical applications as they have high photoelectric conversion efficiency while they absorb solar energy on both sides to generate more power. Thus, the present invention aims to provide a bifacial P-type PERC solar cell which is simple to manufacture, low in cost, easy to popularize, and has a high photoelectric conversion efficiency.

SUMMARY

An objective to be addressed by the present invention is to provide a bifacial P-type PERC solar cell which is simple in structure, low in cost, easy to popularize, and has a high photoelectric conversion efficiency.

Another objective to be addressed by the present invention is to provide a method of preparing the bifacial P-type PERC solar cell, which is simple in process, low in cost, easy to popularize, and has a high photoelectric conversion efficiency.

Yet another objective to be addressed by the present invention is to provide a bifacial P-type PERC solar cell module which is simple in structure, low in cost, easy to popularize, and has a high photoelectric conversion efficiency.

Still another objective to be addressed by the present invention is to provide a bifacial P-type PERC solar system which is simple in structure, low in cost, easy to popularize, and has a high photoelectric conversion efficiency.

To address the objectives above, the present invention provides a bifacial P-type PERC solar cell which consecutively comprises a rear silver electrode, rear aluminum grid, a rear passivation layer, P-type silicon, an N-type emitter, a front silicon nitride film, and a front silver electrode, wherein the rear silver electrode intersects with the rear aluminum grid lines by a first predetermined angle, the first predetermined angle being greater than 10 degrees and smaller than 90 degrees.

A first laser grooving region is formed in the rear passivation layer with laser grooving, wherein the first laser grooving region is provided below the rear aluminum grid lines, the rear aluminum grid lines are connected with the P-type silicon via the first laser grooving region, an outer aluminum grid frame is arranged at periphery of the rear aluminum grid lines and is connected with the rear aluminum grid lines and the rear silver electrode.

The rear aluminum grid lines each may be in a curved shape, an arc shape, a wavy shape, etc.

The first laser grooving region includes a plurality of groups of first laser grooving units and each group of the first laser grooving units contains one or more first laser grooving bodies, wherein the rear aluminum grid lines intersect with the first laser grooving bodies by a second predetermined angle, the second predetermined angle being greater than 10 degrees and smaller than and equal to 90 degrees.

As a preferred example of the above embodiments, a second laser grooving region is provided below the outer aluminum grid frame and includes a plurality of groups of second laser grooving units, wherein each group of the second laser grooving units contains one or more second laser grooving bodies and the outer aluminum grid frame intersects with the second laser grooving bodies by a third predetermined angle, the third predetermined angle being greater than 10 degrees and smaller than and equal to 90 degrees.

As a preferred example of the above embodiments, the rear silver electrode intersects with the rear aluminum grid lines by the first predetermined angle, the first predetermined angle being greater than 30 degrees and smaller than 90 degrees;

the rear aluminum grid lines intersect with the first laser grooving bodies by the second predetermined angle, the second predetermined angle being equal to 90 degrees;

the outer aluminum grid frame intersects with the second laser grooving bodies by the third predetermined angle, the third predetermined angle being equal to 90 degrees.

As a preferred example of the above embodiments, the first laser grooving units are arranged in parallel;

in each of the first laser grooving units, the first laser groove bodies are arranged side by side, and in the same horizontal plane or staggered up and down;

spacing between the first laser grooving units is 0.5-50 mm;

in each of the first laser grooving units, spacing between the first laser grooving bodies is 0.5-50 mm;

the first laser grooving bodies each have a length of 50-5000 micron and a width of 10-500 micron;

the number of the rear aluminum grid lines is 30-500;

the rear aluminum grid lines each have a width of 30-500 micron and the width of the rear aluminum grid lines is smaller than the length of the first laser grooving bodies.

As a preferred example of the above embodiments, the rear passivation layer includes an aluminum oxide layer and a silicon nitride layer, the aluminum oxide layer is connected with the P-type silicon and the silicon nitride layer is connected with the aluminum oxide layer;

the silicon nitride layer has a thickness of 20-500 nm;

the aluminum oxide layer has a thickness of 2-50 nm.

Correspondingly, the present invention also discloses a method of preparing a bifacial P-type PERC solar cell comprising:

(1) forming textured surfaces at a front surface and a rear surface of a silicon wafer, the silicon wafer being P-type silicon;

(2) performing diffusion on the silicon wafer to form an N-type emitter;

(3) removing phosphosilicate glass on the front surface and peripheral p-n junctions formed during the diffusion;

(4) depositing an aluminum oxide film on the rear surface of the silicon wafer;

(5) depositing a silicon nitride film on the rear surface of the silicon wafer;

(6) depositing a silicon nitride film on the front surface of the silicon wafer;

(7) performing laser grooving in the rear surface of the silicon wafer to form a first laser grooving region, wherein the first laser grooving region includes a plurality of groups of first laser grooving units, each group of the first laser grooving units contains one or more first laser grooving bodies;

(8) printing a rear silver busbar electrode on the rear surface of the silicon wafer;

(9) printing aluminum paste on the rear surface of the silicon wafer to obtain rear aluminum grid lines, wherein the rear silver electrode intersects with the rear aluminum grid lines by a first predetermined angle and the rear aluminum grid lines intersect with the first laser grooving bodies by a second predetermined angle, wherein the first predetermined angle is greater than 10 degrees and smaller than 90 degrees and the second predetermined angle is greater than 10 degrees and smaller than and equal to 90 degrees;

(10) printing aluminum paste on the rear surface of the silicon wafer along periphery of the rear aluminum grid lines to obtain an outer aluminum grid frame;

(11) printing front electrode paste on the front surface of the silicon wafer;

(12) sintering the silicon wafer at a high temperature to form a rear silver electrode and a front silver electrode;

(13) performing anti-LID annealing on the silicon wafer.

As a preferred example of the above embodiments, between the steps (3) and (4), the method also includes:

polishing the rear surface of the silicon wafer.

As a preferred example of the above embodiments, the step (7) also includes:

performing laser grooving in the rear surface of the silicon wafer to form a second laser grooving region, wherein the second laser grooving region includes a plurality of groups of second laser grooving units and each group of the second laser grooving units contains one or more second laser grooving bodies;

the outer aluminum grid frame intersects with the second laser grooving bodies by a third predetermined angle, the third predetermined angle being greater than 10 degrees and smaller than and equal to 90 degrees.

Correspondingly, the present invention also discloses a PERC solar cell module comprising a PERC solar cell and a packaging material, wherein the PERC solar cell is any of the bifacial P-type PERC solar cells described above.

Correspondingly, the present invention also discloses a PERC solar system comprising a PERC solar cell, wherein the PERC solar cell is any of the bifacial P-type PERC solar cells described above.

The beneficial effects of the present invention are as follows.

In the present invention, the rear aluminum grid lines are achieved by forming the rear passivation layer on the rear surface of the silicon wafer, subsequently forming the first laser grooving region in the rear passivation layer with laser grooving, and then printing the aluminum paste in a direction angled with or perpendicular to the laser scribing direction, such that the aluminum paste is connected with the P-type silicon via the grooving region. The rear silver electrode intersects with the rear aluminum grid lines by a first predetermined angle, the first predetermined angle being greater than 10 degrees and smaller than 90 degrees, which can improve the capabilities of the rear silver electrode and the rear aluminum grid lines in electron collection and enhance the photoelectric conversion efficiency.

The rear aluminum grid lines intersect with the first laser grooving bodies by a second predetermined angle, the second predetermined angle being greater than 10 degrees and smaller than and equal to 90 degrees. When preparing the cell grid line structure, the bifacial PERC solar cell may employ a method different from the conventional one for printing the aluminum paste. As the width of the aluminum grid lines is much smaller than the length of the laser grooving region, precise alignment of the aluminum paste and the laser grooving region is not necessary, which simplifies the laser process and the printing process, lowers the difficulty in debugging the printing device, and is easy to scale-up for industrial production. Furthermore, the laser grooving region that is not covered by the aluminum paste may increase sunlight absorption at the rear surface of the cell, thus increasing the photoelectric conversion efficiency of the cell.

Moreover, during printing, due to a high viscosity of the aluminum paste and a narrow line width of the printing screen, a broken aluminum grid line occurs occasionally. The broken aluminum grid line would lead to a black broken grid line in an image of EL test. Meanwhile, the broken aluminum grid line will also affect the photoelectric conversion efficiency of the cell. For this reason, an outer aluminum grid frame is arranged at the periphery of the rear aluminum grid lines in the present invention, wherein the outer aluminum grid frame is connected with the rear aluminum grid lines and the rear silver electrode. The outer aluminum grid frame provides an additional transmission path for electrons, thus preventing the problems of broken grid lines in the EL test due to the broken aluminum grid lines and low photoelectric conversion efficiency.

A second laser grooving region may be or may not be provided below the outer aluminum grid frame. If the second laser grooving region is present, precise alignment of the aluminum paste and the second laser grooving region may be unnecessary, which simplifies the laser process and the printing process and lowers the difficulty in debugging the printing device. Furthermore, the second laser grooving region that is not covered by the aluminum paste may increase sunlight absorption at the rear surface of the cell, thus increasing the photoelectric conversion efficiency of the cell.

Therefore, the present invention is simple in structure, simple in process, low in cost, easy to popularize, and has a high photoelectric conversion efficiency.

DETAILED DESCRIPTION OF EMBODIMENTS

To more clearly illustrate the objectives, technical solutions and advantages of the present invention, the present invention will be further described in detail below with reference to the accompanying drawings.

An existing monofacial solar cell is provided at the rear side of the cell with an all-aluminum back electric field covering the entire rear surface of a silicon wafer. The all-aluminum back electric field functions to increase the open-circuit voltage Voc and the short-circuit current Jsc, force the minority carriers away from the surface, and decrease the recombination rate of the minority carriers, so as to increase the cell efficiency as a whole. However, as the all-aluminum back electric field is opaque, the rear side of the solar cell, which has the all-aluminum back electric field, cannot absorb light energy, and light energy can only be absorbed at the front side. The overall photoelectric conversion efficiency of the cell can hardly be improved significantly.

Figure 1:
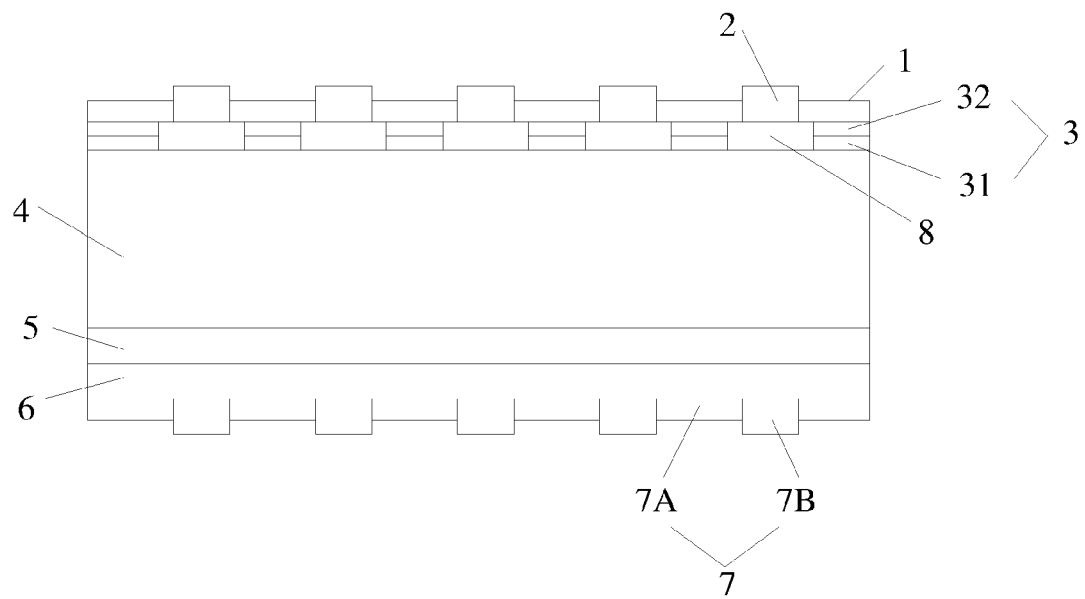
FIG. 1 is a section view of a bifacial P-type PERC solar cell according to the present invention.

In view of the technical problem above, referring to FIG. 1, the present invention provides a bifacial P-type PERC solar cell which consecutively includes a rear silver electrode 1, a rear aluminum grid 2, a rear passivation layer 3, P-type silicon 4, an N-type emitter 5, a front silicon nitride film 6, and a front silver electrode 7. A first laser grooving region 8 is formed in the rear passivation layer 3 by laser grooving. The rear aluminum grid line 2 is connected to the P-type silicon 4 via the first laser grooving region 8. The front silver electrode 7 includes a front silver electrode busbar 7A and a front silver electrode finger 7B. The rear passivation layer 3 includes an aluminum oxide layer 31 and a silicon nitride layer 32.

The present invention improves the existing monofacial PERC solar cells and provides many back aluminum grid lines 2 in replacement of the all-aluminum back electric field. Laser grooving regions 8 are provided in the rear passivation layer 3 with a laser grooving technique, and the rear aluminum grid lines 2 are printed on these parallel-arranged laser grooving regions 8 to be in local contact with the P-type silicon 4. The rear aluminum grid lines 2 arranged in dense and parallel manner can play a role of increasing the open-circuit voltage Voc and the short-circuit current Jsc, reducing the recombination rate of the minority carriers, and thus enhancing the photoelectric conversion efficiency of the cell, to replace the all-aluminum back electric field in the existing monofacial cell structure. Moreover, since the rear surface of the silicon wafer is not completely covered by the rear aluminum grid lines 2, sunlight can be projected into the silicon wafer between the rear aluminum grid lines 2. Accordingly, the rear surface of the silicon wafer can absorb the light energy, which greatly improves the photoelectric conversion efficiency of the cell.

Figure 2:
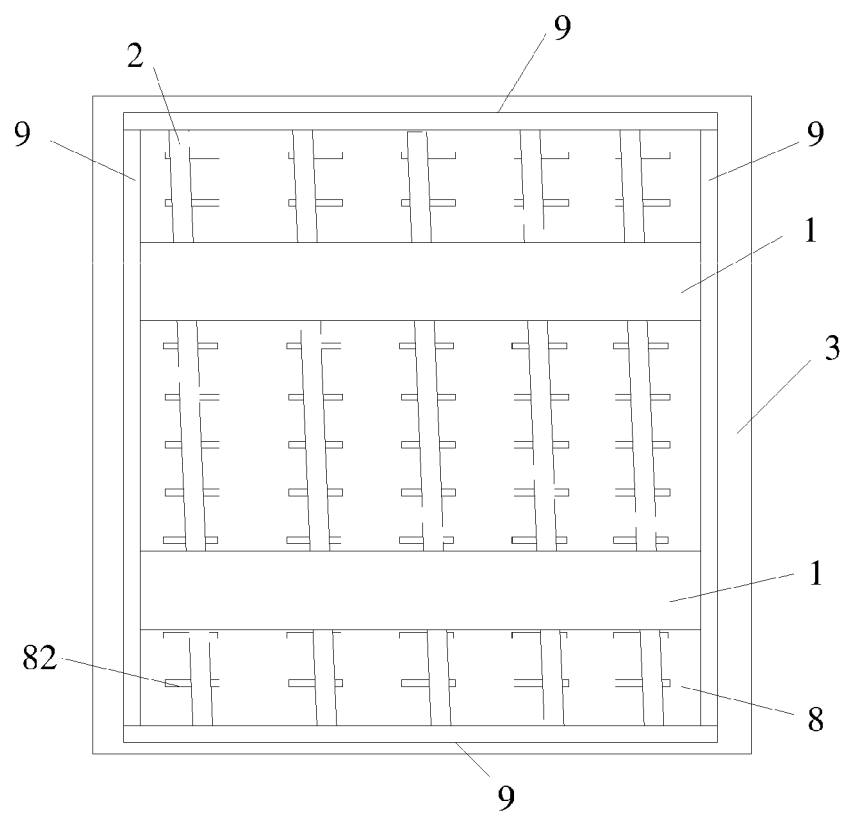
FIG. 2 is a schematic diagram of a first embodiment of a rear surface structure of the bifacial P-type PERC solar cell according to the present invention.
Figure 3:
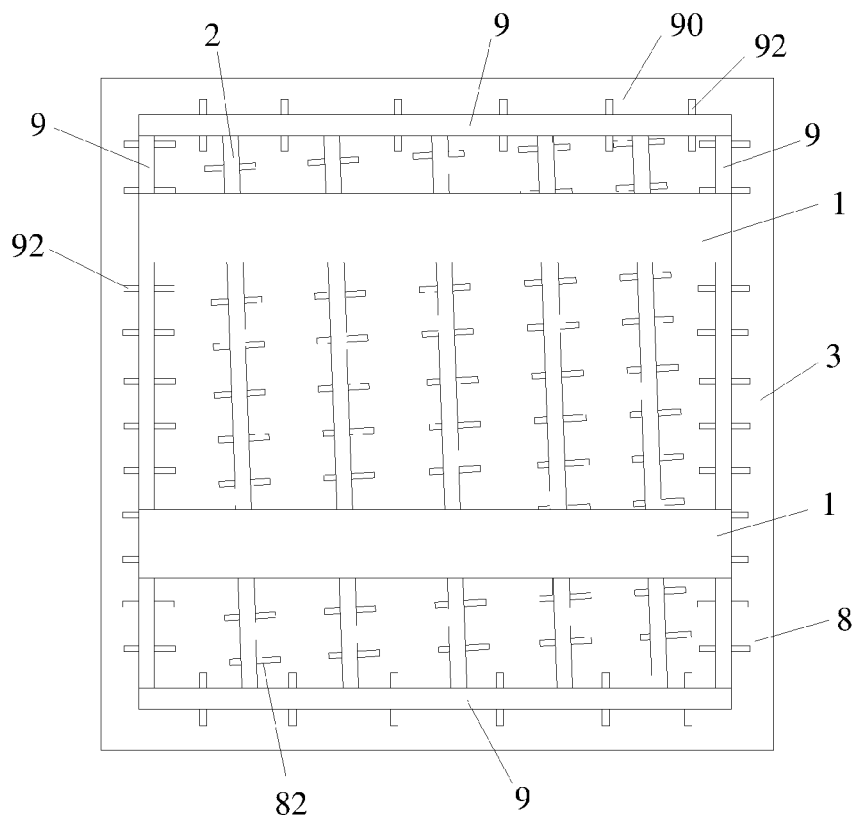
FIG. 3 is a schematic diagram of a second embodiment of a rear surface structure of the bifacial P-type PERC solar cell according to the present invention.

As shown in FIGS. 2 and 3, the rear silver electrode 1 and the rear aluminum grid line 2 intersect by a first predetermined angle, the first predetermined angle being greater than 10 degrees and smaller than 90 degrees. This can improve the capabilities of the rear silver electrode 1 and the rear aluminum grid line 2 in electron collection and enhance the photoelectric conversion efficiency. Preferably, the first predetermined angle is greater than 30 degrees and smaller than 90 degrees.

The first laser grooving region 8 includes a plurality of groups of first laser grooving units 81, wherein each group of the first laser grooving units 81 contains one or more first laser grooving bodies 82. The rear aluminum grid line 2 intersects with the first laser grooving body 81 by a second predetermined angle, the second predetermined angle being greater than 10 degrees and smaller than and equal to 90 degrees. Preferably, the rear aluminum grid line 2 perpendicularly intersects with the first laser grooving body 81 and the second predetermined angle is equal to 90 degrees.

See the schematic diagrams of the rear electrode structure shown in FIGS. 2 and 3 for details. As shown in FIG. 2, the rear silver electrode 1 and the rear aluminum grid line 2 intersect in a slanted fashion, and the rear aluminum grid line 2 intersects with the first laser grooving body 82 also in the slanted fashion. As shown in FIG. 3, the rear silver electrode 1 and the rear aluminum grid line 2 intersect in a slanted fashion, and the rear aluminum grid line 2 perpendicularly intersects with the first laser grooving body 82. FIG. 3 is a preferable implementation.

Moreover, during printing, due to a high viscosity of the aluminum paste and a narrow line width of the printing screen, a broken aluminum grid line occurs occasionally. The broken aluminum grid line would lead to a black broken line in an image of EL test. Meanwhile, the broken aluminum line will also affect the photoelectric conversion efficiency of the cell. For this reason, an outer aluminum grid frame 9 is arranged at the periphery of the rear aluminum grid lines in the present invention, wherein the outer aluminum grid frame 9 is connected with the rear aluminum grid lines 2 and the rear silver electrode 1. The outer aluminum grid frame 9 provides an additional transmission path for electrons, thus preventing the problems of broken grid lines in the EL test due to the broken aluminum lines and low photoelectric conversion efficiency.

Figure 4:
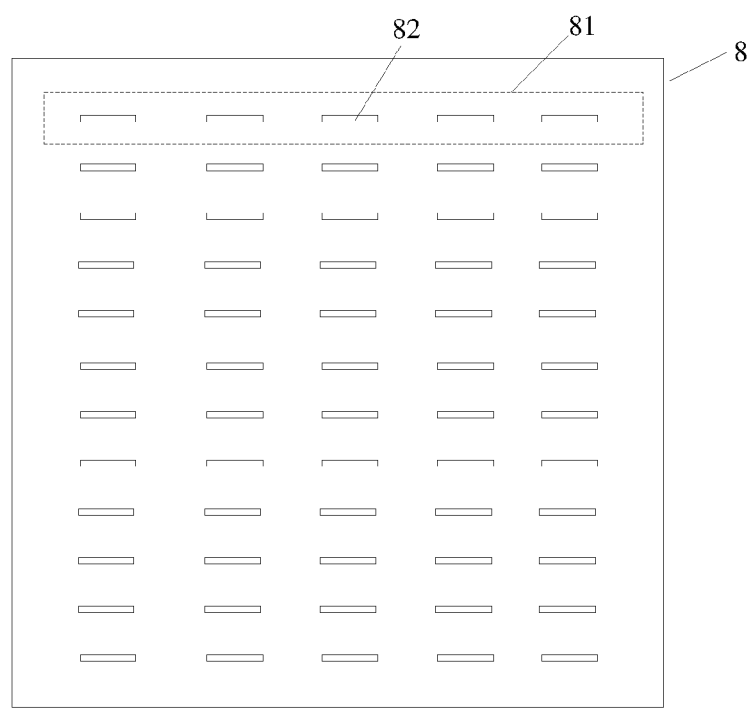
FIG. 4 is a schematic diagram of an embodiment of a first laser grooving region of the bifacial P-type PERC solar cell according to the present invention.
Figure 5:
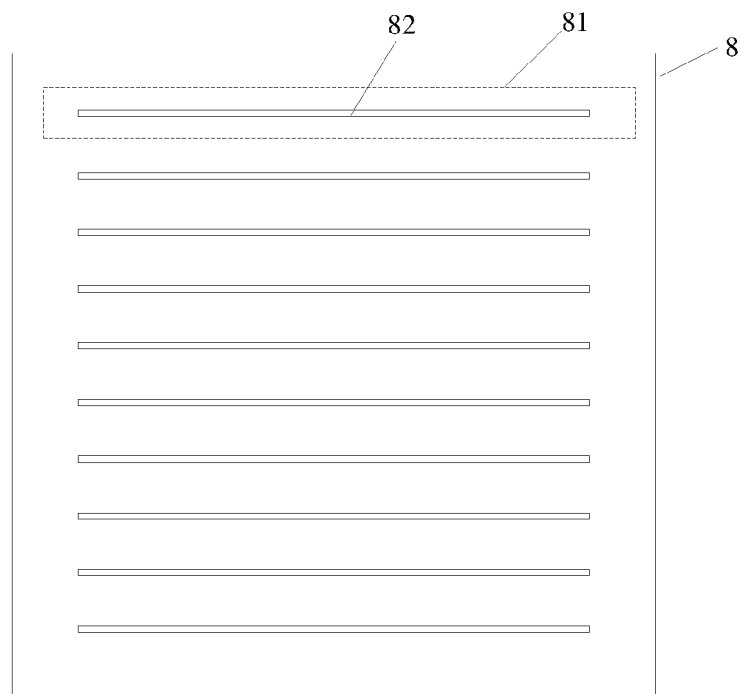
FIG. 5 is a schematic diagram of a further embodiment of a first laser grooving region of the bifacial P-type PERC solar cell according to the present invention.

Further, with reference to FIGS. 4 and 5, the present invention is further elaborated below by taking the horizontally arranged laser grooving unit as an example. Dashed boxes shown in FIGS. 4 and 5 indicate the first laser grooving unit 81 and each group of the first laser grooving units 81 includes one or more first laser grooving bodies 82. The first laser grooving units 81 have various implementations including:

(1) Each group of the first laser grooving units 81 contains one first laser grooving body 82 in which case the first laser grooving unit 81 is a continuous linear grooving region, as specifically shown in FIG. 5.

(2) Each group of the first laser grooving units 81 contains a plurality of first laser grooving bodies 82. In this case, the first laser grooving unit 81 is a discontinuous, line-segment-type linear grooving region, as specifically shown in FIG. 4. The plurality of first laser grooving bodies 82 may include two, three, four or even more first laser grooving bodies 82 and the number of the first laser grooving bodies 82 is not limited thereto.

If each group of the first laser grooving units 81 contains a plurality of first laser grooving bodies 82, there are a few possibilities as follows:

A. The plurality of first laser grooving bodies 82 have the same width, length and shape and the unit of their dimensions is in the order of micron. The length may be of 50-5000 micron, but is not limited thereto. It should be noted that the first laser grooving bodies 82 may be in the same horizontal plane, or may be staggered up and down (i.e., not in the same horizontal plane). The topography of the staggered arrangement depends on production needs.

B. The plurality of first laser grooving bodies 82 have the same width, length and shape and the unit of their dimensions is in the order of millimeter. The length may be of 5-600 mm, but is not limited thereto. It should be noted that the first laser grooving bodies may be in the same horizontal plane, or may be staggered up and down (i.e., not in the same horizontal plane). The topography of the staggered arrangement depends on production needs.

C. The plurality of first laser grooving bodies 82 have different widths, lengths and/or shapes, which can be designed in combination based on the manufacturing requirements. It should be noted that the first laser grooving bodies may be in the same horizontal plane, or may be staggered up and down (i.e., not in the same horizontal plane). The topography of the staggered arrangement depends on production needs.

As a preferred implementation of the present invention, the first laser grooving body has a linear shape to facilitate fabrication, simplify process and lower manufacturing costs. The first laser grooving body also can be configured in other shapes, such as a curved shape, an arc shape, a wavy shape, etc. Its implementations are not limited to the embodiments presented in this invention.

The first laser grooving units 81 are arranged in parallel and the first laser grooving bodies 82 are arranged side by side in each first laser grooving unit 81, which can simplify the production process and is suitable for mass application.

Spacing between the first laser grooving units 81 is 0.5-50 mm and spacing between the first laser grooving bodies 82 is 0.5-50 mm in each first laser grooving unit 81.

The first laser grooving body 82 has a length of 50-5000 micron and a width of 10-500 micron. Preferably, the first laser grooving body 82 is 250-1200 micron long and 30-80 micron wide.

The length, width and spacing of the first laser grooving units 81 and the number and width of the aluminum grids are optimized based on the comprehensive consideration of contact area between the aluminum grid and the P-type silicon, shading area of the aluminum grid, and sufficient collection of electrons, with the purpose of reducing the shading area of the rear aluminum grids as much as possible, while ensuring good current output and further boosting the overall photoelectric conversion efficiency of the cell.

A second laser grooving region 90 may be provided below the outer aluminum grid frame 9 with reference to the first embodiment of the rear surface structure shown in FIG. 3. The outer aluminum grid frame 9 may also be provided without the second laser grooving region 90 disposed below (see the second embodiment of the rear surface structure shown in FIG. 2).

Figure 6:
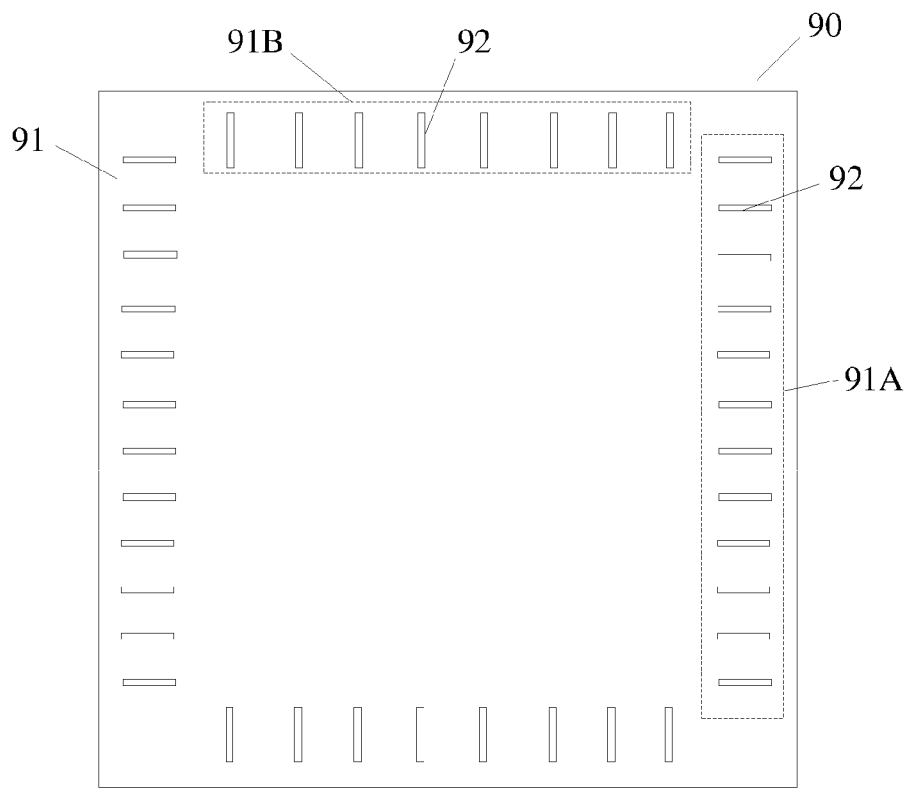
FIG. 6 is a schematic diagram of a second laser grooving region of the bifacial P-type PERC solar cell according to the present invention.

If the second laser grooving region 90 is provided, the second laser grooving region 90 includes a plurality of groups of second laser grooving units 91 and each group of the second laser grooving units 91 contains one or more second laser grooving bodies 92. The outer aluminum grid frame 9 intersects with the second laser grooving body 92 by a third predetermined angle, the third predetermined angle being greater than 10 degrees and smaller than and equal to 90 degrees. Preferably, the outer aluminum grid frame 9 is perpendicularly intersecting with the second laser grooving body 92, and the third predetermined angle is equal to 90 degrees. Specifically, with reference to FIG. 6, the second laser grooving region 90 includes two second laser grooving units 91A disposed in the vertical direction and two second laser grooving units 91B, wherein the second laser grooving unit 91A disposed in the vertical direction includes a plurality of second laser grooving bodies 92 and the second laser grooving unit 91B includes a plurality of second laser grooving bodies 92 disposed in the vertical direction.

If the second laser grooving region 90 is provided, it is unnecessary to precisely align the aluminum paste with the second laser grooving region, which simplifies the laser and printing processes and lowers the difficulty in debugging the printing device. In addition, the second laser grooving region outside the region covered by the aluminum paste can increase sunlight absorption at the rear surface of the cell and boost the photoelectric conversion efficiency of the cell.

The number of the rear aluminum grid lines 2 is 30-500 and each rear aluminum grid line 2 has a width of 30-500 micron, wherein the width of the rear aluminum grid line 2 is much smaller than a length of the first laser grooving body 82. Preferably, the number of the rear aluminum grid lines 2 is 80-200 and each rear aluminum grid line 2 has a width of 50-300 micron.

The width of the rear aluminum grid line is much smaller than the length of the first laser grooving body, which may greatly facilitate the printing of the rear aluminum grid lines if the aluminum grid is perpendicular to the first laser grooving body. The aluminum grid can be provided within the first laser grooving region without precise alignment, which simplifies the laser and printing processes, lowers the difficulty in debugging the printing device and is easy to scale-up for industrial production.

In the present invention, the rear aluminum grid lines are achieved by forming a laser grooving region in the rear passivation layer with laser grooving and then printing the aluminum paste in a direction angled with or perpendicular to the laser scribing direction, such that the aluminum paste is connected with the P-type silicon via the grooving region. By fabricating the cell grid line structures on the front surface and the rear surface of the silicon wafer, the bifacial PERC solar cell may employ a method different from the conventional one for printing the aluminum paste, without the need of precisely aligning the aluminum paste with the first laser grooving region. Such process is simple and easy to scale-up for industrial production. If the aluminum grid line was parallel to the first laser grooving body, it would be necessary to precisely align the aluminum paste with the first laser grooving region, which would put a high demand on the accuracy and repeatability of the printing device. As a result, the yield would be difficult to control and a lot of defective products would be produced, resulting in decreased average photoelectric conversion efficiency. With aid of the present invention, the yield can be boosted to 99.5%.

Furthermore, the rear passivation layer 3 includes an aluminum oxide layer 31 and a silicon nitride layer 32, wherein the aluminum oxide layer 31 is connected with the P-type silicon 4 and the silicon nitride layer 32 is connected with the aluminum oxide layer 31;

The silicon nitride layer 32 has a thickness of 20-500 nm;

The aluminum oxide layer 31 has a thickness of 2-50 nm.

Preferably, the thickness of the silicon nitride layer 32 is 100-200 nm;

The thickness of the aluminum oxide layer 31 is 5-30 nm.

Correspondingly, the present invention also discloses a method of preparing a bifacial P-type PERC solar cell, comprising:

S101: forming textured surfaces at a front surface and a rear surface of a silicon wafer, the silicon wafer being P-type silicon;

S102: performing diffusion on the silicon wafer to form an N-type emitter;

S103: removing phosphosilicate glass on the front surface and peripheral p-n junctions formed during the diffusion;

S104: depositing an aluminum oxide ($Al_2O_3$) film on the rear surface of the silicon wafer;

S105: depositing a silicon nitride film on the rear surface of the silicon wafer;

S106: depositing a silicon nitride film on the front surface of the silicon wafer;

S107: performing laser grooving in the rear surface of the silicon wafer to form a first laser grooving region, wherein the first laser grooving region includes a plurality of groups of first laser grooving units, each group of the first laser grooving units includes one or more first laser grooving bodies;

S108: printing a rear silver busbar electrode on the rear surface of the silicon wafer;

S109: printing aluminum paste on the rear surface of the silicon wafer to obtain a rear aluminum grid line, wherein the rear silver electrode intersects with the rear aluminum grid line by a first predetermined angle and the rear aluminum grid line intersects with the laser grooving body by a second predetermined angle, wherein the first predetermined angle is greater than 10 degrees and smaller than 90 degrees and the second predetermined angle is greater than 10 degrees and smaller than and equal to 90 degrees;

S110: printing aluminum paste on the rear surface of the silicon wafer along periphery of the rear aluminum grid lines to obtain an outer aluminum grid frame;

S111: printing front electrode paste on the front surface of the silicon wafer;

S112: sintering the silicon wafer at a high temperature to form a rear silver electrode and a front silver electrode;

S113: performing anti-LID annealing on the silicon wafer.

It should be noted that the sequence of S106, S104 and S105 may be changed. S106 may be performed before S104 and S105. S109 and S110 can be combined into one step, i.e., the rear aluminum grid line and the outer aluminum grid frame are completed in a single printing.

Between S103 and S104, there is also included a step of polishing the rear surface of the silicon wafer. The present invention may be provided with or without the step of polishing the rear surface.

A second laser grooving region may be or may not be provided below the outer aluminum grid frame. If the second laser grooving region is present, the step (7) also includes:

performing laser grooving in the rear surface of the silicon wafer to form the second laser grooving region, wherein the second laser grooving region includes a plurality of groups of second laser grooving units and each group of the second laser grooving units contains one or more second laser grooving bodies; the outer aluminum grid frame intersects with the second laser grooving body by a third predetermined angle, the third predetermined angle being greater than 10 degrees and smaller than and equal to 90 degrees.

It should also be noted that the specific parameter settings of the first laser grooving region, the second laser grooving region, the rear aluminum grid line and the outer aluminum grid frame in the preparation method are identical to those described above and will not be repeated here.

Accordingly, the present invention also discloses a PERC solar cell module, which includes a PERC solar cell and a packaging material, wherein the PERC solar cell is any one of the bifacial P-type PERC solar cells described above. Specifically, as one embodiment of the PERC solar cell module, it is composed of a first high-transmittance tempered glass, a first layer of ethylene-vinyl acetate (EVA) copolymer, a PERC solar cell, a second layer of an ethylene-vinyl acetate (EVA) copolymer, and a second high-transmittance tempered glass which are sequentially connected from top to bottom.

Accordingly, the present invention also discloses a PERC solar system, which includes a PERC solar cell that is any one of the bifacial P-type PERC solar cells described above. As a preferred embedment of the PERC solar system, it includes a PERC solar cell, a rechargeable battery pack, a charge and discharge controller, an inverter, an AC power distribution cabinet, and a sun-tracking control system. The PERC solar system therein may be provided with or without a rechargeable battery pack, a charge and discharge controller, and an inverter. Those skilled in the art can adopt different settings according to actual needs.

It should be noted that in the PERC solar cell module and the PERC solar system, components other than the bifacial P-type PERC solar cell may be designed with reference to the prior art.

The present invention will be further described with reference to embodiments.

Embodiment 1

(1) forming textured surfaces at a front surface and a rear surface of a silicon wafer, the silicon wafer being P-type silicon;

(2) performing diffusion on the silicon wafer to form an N-type emitter;

(3) removing phosphosilicate glass on the front surface and peripheral p-n junctions formed during the diffusion;

(4) depositing an aluminum oxide (Al$_2$O$_3$) film on the rear surface of the silicon wafer;

(5) depositing a silicon nitride film on the rear surface of the silicon wafer;

(6) depositing a silicon nitride film on the front surface of the silicon wafer;

(7) performing laser grooving in the rear surface of the silicon wafer to form a first laser grooving region, wherein the first laser grooving region includes a plurality of groups of first laser grooving units, each group of the first laser grooving units includes one or more first laser grooving bodies, wherein the first laser grooving body has a length of 1000 micron and a width of 40 micron;

(8) printing a rear silver busbar electrode on the rear surface of the silicon wafer;

(9) printing aluminum paste on the rear surface of the silicon wafer to obtain a rear aluminum grid line, wherein the rear silver electrode intersects with the rear aluminum grid line by a first predetermined angle and the rear aluminum grid line intersects with the first laser grooving body by a second predetermined angle, wherein the first predetermined angle is 10 degrees and the second predetermined angle is 30 degrees; the number of the rear aluminum grid lines is 150, and the rear aluminum grid line has a width of 150 micron;

(10) printing aluminum paste on the rear surface of the silicon wafer along periphery of the rear aluminum grid lines to obtain an outer aluminum grid frame;

(11) printing front electrode paste on the front surface of the silicon wafer;

(12) sintering the silicon wafer at a high temperature to form a rear silver electrode and a front silver electrode;

(13) performing anti-LID annealing on the silicon wafer.

Embodiment 2

(1) forming textured surfaces at a front surface and a rear surface of a silicon wafer, the silicon wafer being P-type silicon;

(2) performing diffusion on the silicon wafer to form an N-type emitter;

(3) removing phosphosilicate glass on the front surface and peripheral p-n junctions formed during the diffusion and polishing the rear surface of the silicon wafer;

(4) depositing an aluminum oxide (Al$_2$O$_3$) film on the rear surface of the silicon wafer;

(5) depositing a silicon nitride film on the rear surface of the silicon wafer;

(6) depositing a silicon nitride film on the front surface of the silicon wafer;

(7) performing laser grooving in the rear surface of the silicon wafer to form first and second laser grooving regions, wherein the first laser grooving region includes a plurality of groups of first laser grooving units, each group of the first laser grooving units includes one or more first laser grooving bodies, wherein the first laser grooving body has a length of 500 micron and a width of 50 micron;

the second laser grooving region includes two vertically arranged second laser grooving units and two horizontally arranged second laser grooving units, wherein each group of the second laser grooving units includes one or more second laser grooving bodies, the second laser grooving body having a length of 500 micron and a width of 50 micron;

(8) printing a rear silver busbar electrode on the rear surface of the silicon wafer;

(9) printing aluminum paste on the rear surface of the silicon wafer to obtain a rear aluminum grid line, wherein the rear silver electrode intersects with the rear aluminum grid line by a first predetermined angle and the rear aluminum grid line intersects with the laser grooving body by a second predetermined angle, wherein the first predetermined angle is 30 degrees and the second predetermined angle is 90 degrees; the number of the rear aluminum grid lines is 200, and the rear aluminum grid line has a width of 200 micron;

(10) printing aluminum paste on the rear surface of the silicon wafer along periphery of the rear aluminum grid lines to obtain an outer aluminum grid frame, wherein the angle between the outer aluminum grid frame and the second laser grooving body is 90 degrees;

(11) printing front electrode paste on the front surface of the silicon wafer;

(12) sintering the silicon wafer at a high temperature to form a rear silver electrode and a front silver electrode;

(13) performing anti-LID annealing on the silicon wafer.

Embodiment 3

(1) forming textured surfaces at a front surface and a rear surface of a silicon wafer, the silicon wafer being P-type silicon;

(2) performing diffusion on the silicon wafer to form an N-type emitter;

(3) removing phosphosilicate glass on the front surface and peripheral p-n junctions formed during the diffusion;

(4) depositing an aluminum oxide (Al$_2$O$_3$) film on the rear surface of the silicon wafer;

(5) depositing a silicon nitride film on the rear surface of the silicon wafer;

(6) depositing a silicon nitride film on the front surface of the silicon wafer;

(7) performing laser grooving in the rear surface of the silicon wafer to form a first laser grooving region, wherein the first laser grooving region includes a plurality of groups of first laser grooving units, each group of the first laser grooving units includes one or more first laser grooving bodies, wherein the first laser grooving body has a length of 300 micron and a width of 30 micron;

(8) printing a rear silver busbar electrode on the rear surface of the silicon wafer;

(9) printing aluminum paste on the rear surface of the silicon wafer to obtain a rear aluminum grid line, wherein the rear silver electrode intersects with the rear aluminum grid line by a first predetermined angle and the rear aluminum grid line intersects with the first laser grooving body by a second predetermined angle, wherein the first predetermined angle is 45 degrees and the second predetermined angle is 60 degrees; the number of the rear aluminum grid lines is 250, and the rear aluminum grid line has a width of 250 micron;

(10) printing aluminum paste on the rear surface of the silicon wafer along periphery of the rear aluminum grid lines to obtain an outer aluminum grid frame;

(11) printing front electrode paste on the front surface of the silicon wafer;

(12) sintering the silicon wafer at a high temperature to form a rear silver electrode and a front silver electrode;

(13) performing anti-LID annealing on the silicon wafer.

Embodiment 4

(1) forming textured surfaces at a front surface and a rear surface of a silicon wafer, the silicon wafer being P-type silicon;

(2) performing diffusion on the silicon wafer to form an N-type emitter;

(3) removing phosphosilicate glass on the front surface and peripheral p-n junctions formed during the diffusion and polishing the rear surface of the silicon wafer;

(4) depositing an aluminum oxide ($Al_2O_3$) film on the rear surface of the silicon wafer;

(5) depositing a silicon nitride film on the rear surface of the silicon wafer;

(6) depositing a silicon nitride film on the front surface of the silicon wafer;

(7) performing laser grooving in the rear surface of the silicon wafer to form a first laser grooving region, wherein the first laser grooving region includes a plurality of groups of first laser grooving units, each group of the first laser grooving units includes one or more first laser grooving bodies, wherein the first laser grooving body has a length of 1200 micron and a width of 200 micron;

the second laser grooving region includes two vertically arranged second laser grooving units and two horizontally arranged second laser grooving units, wherein each group of the second laser grooving units includes one or more second laser grooving bodies, the second laser grooving body is perpendicular to an outer aluminum grid frame; the second laser grooving body having a length of 1200 micron and a width of 200 micron;

(8) printing a rear silver busbar electrode on the rear surface of the silicon wafer;

(9) printing aluminum paste on the rear surface of the silicon wafer to obtain a rear aluminum grid line, wherein the rear silver electrode intersects with the rear aluminum grid line by a first predetermined angle and the rear aluminum grid line intersects with the laser grooving body by a second predetermined angle, wherein the first predetermined angle is 15 degrees and the second predetermined angle is 90 degrees; the number of the rear aluminum grid lines is 300, and the rear aluminum grid line has a width of 300 micron;

(10) printing aluminum paste on the rear surface of the silicon wafer along periphery of the rear aluminum grid lines to obtain the outer aluminum grid frame, wherein the angle between the outer aluminum grid frame and the second laser grooving body is 90 degrees;

(11) printing front electrode paste on the front surface of the silicon wafer;

(12) sintering the silicon wafer at a high temperature to form a rear silver electrode and a front silver electrode;

(13) performing anti-LID annealing on the silicon wafer.

Finally, it should be noted that the above embodiments are only intended to illustrate the technical solutions of the present invention and are not intended to limit the protection scope of the present invention. Although the present invention has been described in detail with reference to the preferred embodiments, it should be appreciated by those skilled in the art that the technical solutions of the present invention may be modified or equivalently substituted without departing from the spirit and scope of the technical solutions of the present invention.

We claim:

1. A method of preparing a bifacial P-type PERC solar cell, comprising:

(1) forming textured surfaces at a front surface and a rear surface of a silicon wafer, the silicon wafer being P-type silicon;

(2) performing diffusion on the silicon wafer to form an N-type emitter;

(3) removing phosphosilicate glass on the front surface and peripheral p-n junctions formed during the diffusion;

(4) depositing an aluminum oxide film on the rear surface of the silicon wafer;

(5) depositing a silicon nitride film on the rear surface of the silicon wafer;

(6) depositing a silicon nitride film on the front surface of the silicon wafer;

(7) performing laser grooving in the rear surface of the silicon wafer to form a first laser grooving region, wherein the first laser grooving region includes a plurality of groups of first laser grooving units, and each group of the first laser grooving units contains one or more first laser grooving bodies;

(8) printing a rear silver busbar electrode on the rear surface of the silicon wafer;

(9) printing aluminum paste on the rear surface of the silicon wafer to obtain rear aluminum grid lines, wherein the rear aluminum grid lines are printed on the first laser grooving region with an angle being greater than 10 degrees and smaller than 90 degrees, such that the rear aluminum grid lines are connected to the P-type silicon via the first laser grooving region, wherein the rear silver busbar electrode intersects with the rear aluminum grid lines by a first predetermined angle, the first predetermined angle being greater than 10 degrees and smaller than 90 degrees;

(10) printing aluminum paste on the rear surface of the silicon wafer along a periphery of the rear aluminum grid lines to obtain an outer aluminum grid frame;

(11) printing electrode paste on the front surface of the silicon wafer;

(12) sintering the silicon wafer to form a rear silver electrode and a front silver electrode;

(13) performing anti-LID annealing on the silicon wafer.

2. The method of preparing the bifacial P-type PERC solar cell of claim 1, further comprising between the steps (3) and (4):

polishing the rear surface of the silicon wafer.

3. The method of preparing the bifacial P-type PERC solar cell of claim 2, wherein the step (7) further comprises:

performing laser grooving in the rear surface of the silicon wafer to form a second laser grooving region, wherein the second laser grooving region includes a plurality of groups of second laser grooving units and each group of the second laser grooving units contains one or more second laser grooving bodies;

wherein the outer aluminum grid frame intersects with the second laser grooving bodies by a third predetermined angle, the third predetermined angle being greater than 10 degrees and smaller than and equal to 90 degrees.

* * * * *